US012347465B2

(12) United States Patent
Contreras et al.

(10) Patent No.: US 12,347,465 B2
(45) Date of Patent: Jul. 1, 2025

(54) DIFFERENTIAL SENSE OF EMBEDDED CONTACT SENSOR (ECS) AND NEAR-FIELD TEMPERATURE SENSOR (NTS) UTILIZING CHOPPING AMPLIFIER

(71) Applicant: Western Digital Technologies, Inc., San Jose, CA (US)

(72) Inventors: John T. Contreras, Palo Alto, CA (US); Joey M. Poss, Rochester, MN (US); Bernhard E. Knigge, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 75 days.

(21) Appl. No.: 18/506,620

(22) Filed: Nov. 10, 2023

(65) Prior Publication Data

US 2025/0157495 A1    May 15, 2025

(51) Int. Cl.
*G11B 33/14*    (2006.01)
*H03F 3/04*    (2006.01)

(52) U.S. Cl.
CPC ............. *G11B 33/144* (2013.01); *H03F 3/04* (2013.01); *H03F 2200/294* (2013.01)

(58) Field of Classification Search
None
See application file for complete search history.

(56) References Cited

U.S. PATENT DOCUMENTS

| 7,375,913 | B2* | 5/2008 | Satoh | G11B 5/6064 360/246 |
| 7,541,875 | B2* | 6/2009 | Taylor | H03F 1/3205 330/133 |
| 8,830,614 | B2* | 9/2014 | Garzon | G11B 5/607 360/234.4 |
| 2004/0114268 | A1* | 6/2004 | Satoh | G11B 5/6064 |
| 2005/0129090 | A1* | 6/2005 | Sheperek | G01K 3/00 374/185 |
| 2008/0212236 | A1* | 9/2008 | Satoh | G11B 5/6064 |
| 2010/0272139 | A1* | 10/2010 | Hsin | G11B 7/1263 372/38.07 |
| 2013/0176643 | A1* | 7/2013 | Contreras | G11B 5/6064 |
| 2014/0153130 | A1* | 6/2014 | Garzon | G11B 5/607 360/75 |
| 2024/0003750 | A1* | 1/2024 | Contreras | G01K 7/24 |
| 2024/0005957 | A1* | 1/2024 | Contreras | G11B 27/36 |
| 2024/0175765 | A1* | 5/2024 | Contreras | G01K 7/24 |

* cited by examiner

*Primary Examiner* — Fred Tzeng
(74) *Attorney, Agent, or Firm* — NOD Law PC

(57) ABSTRACT

A data storage device comprises a first resistive temperature detector (RTD) and a second RTD coupled to a first voltage source. A tuning bridge coupled between the first and second RTDs and a second voltage source reduces offset between a first bias voltage across the first RTD and a second bias voltage across the second RTD. A low noise amplifier (LNA) receives the first and second bias voltages as a differential bias voltage. A modulator coupled between the first and second RTDs and the LNA modulates the differential bias voltage.

26 Claims, 10 Drawing Sheets

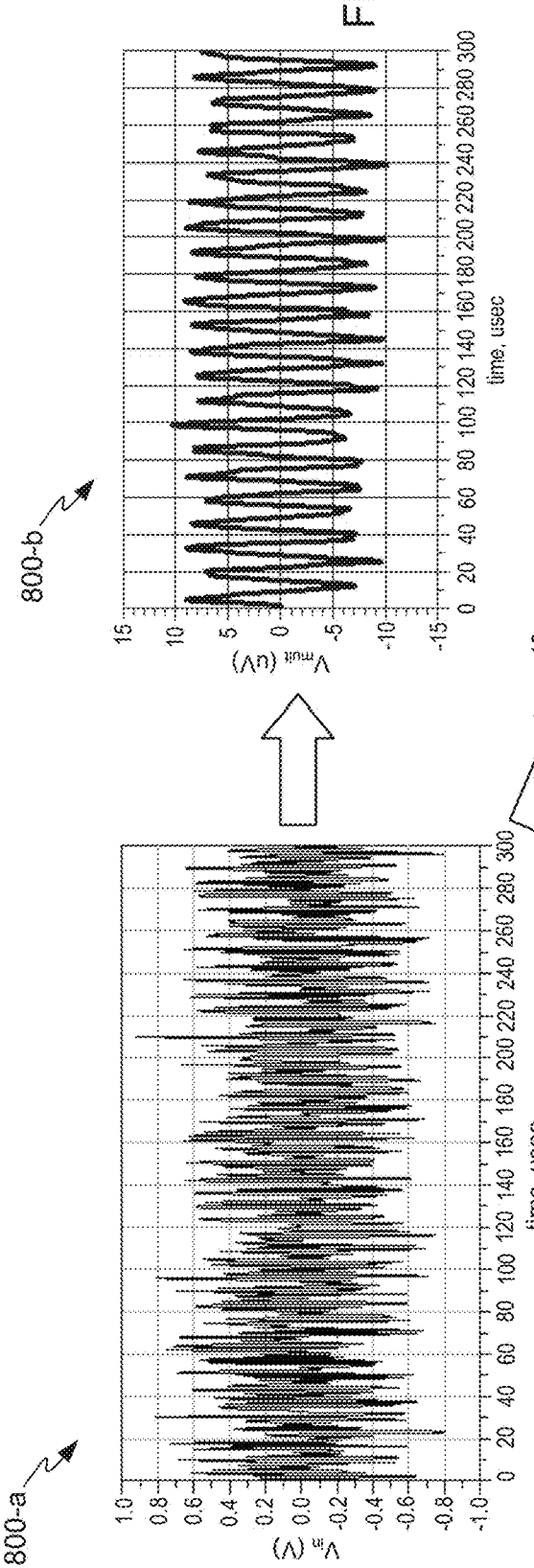
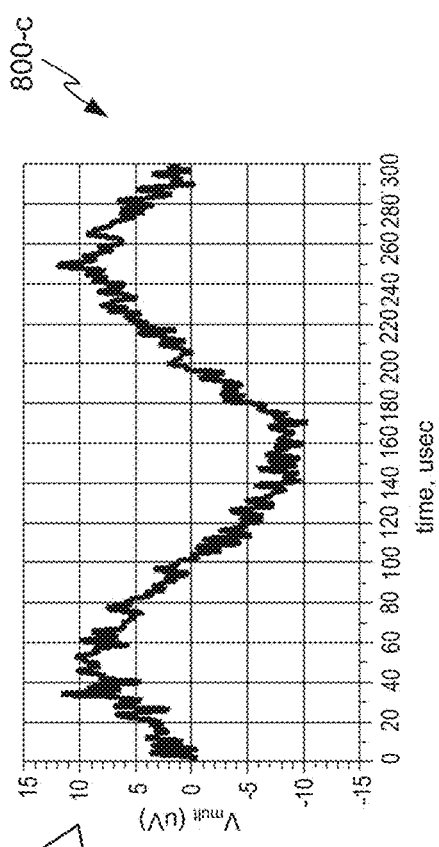
FIG. 8B
FIG. 8C
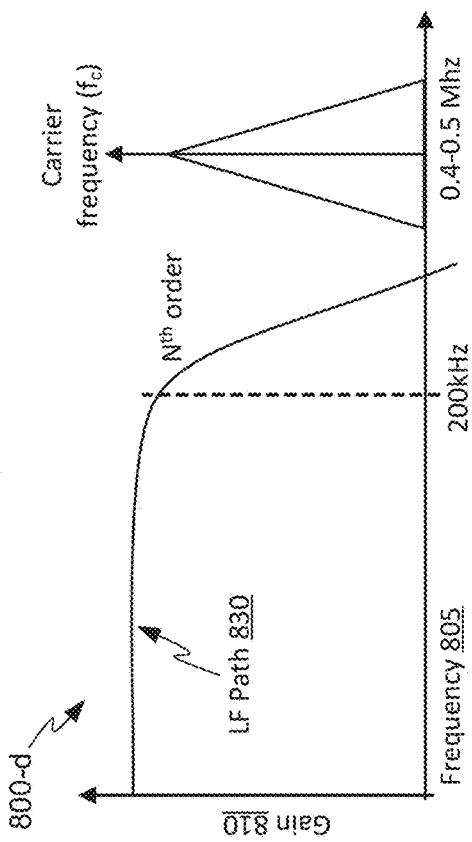
FIG. 8A
FIG. 8D

DIFFERENTIAL SENSE OF EMBEDDED CONTACT SENSOR (ECS) AND NEAR-FIELD TEMPERATURE SENSOR (NTS) UTILIZING CHOPPING AMPLIFIER

BACKGROUND

Data storage devices such as disk drives comprise one or more disks and one or more read/write heads connected to distal ends of actuator arms, which are rotated by actuators (e.g., a voice coil motor, one or more fine actuators) to position the heads radially over surfaces of the disks at carefully controlled fly heights over the disk surfaces. The disk surfaces comprise a plurality of radially spaced, concentric tracks for recording user data sectors and servo wedges or sectors. The servo tracks are written on previously blank disk drive surfaces as part of the final stage of preparation of the disk drive. The servo sectors comprise head positioning information (e.g., a track address) that is read by the heads and processed by a servo control system to control the actuator arms as they seek from track to track.

FIG. 1 is a conceptual diagram of a conventional disk format 2 comprising a number of radially-spaced, concentric servo tracks 4 defined by servo wedges $6_0 \ldots 6_N$ recorded around the circumference of each servo track 4. A plurality of concentric data tracks are defined relative to servo tracks 4 and may have the same or a different radial density (e.g., tracks per inch) than servo tracks 4. Each servo wedge (e.g., servo wedge $6_4$) comprises a preamble 8 for storing a periodic pattern that allows for proper gain adjustment and timing synchronization of the read signal, and a sync mark 10 for storing a special pattern used to symbol synchronize to a servo data field 12. Servo data field 12 stores coarse head positioning information, such as a servo track address, used to position the head over a target data track during a seek operation. Each servo wedge further comprises groups of phase-based servo bursts 14 (e.g., N and Q servo bursts) that are recorded with a predetermined phase relative to one another and relative to the servo track centerlines.

The coarse head positioning information is processed to position a head over a target data track during a seek operation, and servo bursts 14 provide fine head positioning information used for centerline tracking while accessing a data track during read and write operations. A position error signal (PES) generated by reading servo bursts 14 represents a measured position of the head relative to a centerline of a target servo track. A servo controller processes the PES to generate a control signal applied to an actuator to actuate the head radially over the disk in a direction that reduces the PES.

The description provided in this background section should not be assumed to be prior art merely because it is mentioned in or associated with this background section. The background section may include information that describes one or more aspects of the subject technology.

SUMMARY

The following summary relates to one or more aspects or embodiments disclosed herein. It is not an extensive overview relating to all contemplated aspects or embodiments, and should not be regarded as identifying key or critical elements of all contemplated aspects or embodiments, or as delineating the scope associated with any particular aspect or embodiment. The following summary has the sole purpose of presenting certain concepts relating to one or more aspects or embodiments disclosed herein in a simplified form to precede the detailed description that follows.

Hard disk drives (HDDs) include read and write elements residing within a component known as a slider that flies over a disk. Ever-growing demands for increased data density dictate that the read and write elements fly as close as possible to the disk surface. As fly heights diminish, accurate monitoring and control of the fly height is critical. A resistive temperature detector (RTD) may be used to monitor and measure fly height by leveraging the temperature-dependent properties of the RTD material. The basic principle behind using an RTD to monitor fly height is that the temperature of the RTD changes with its proximity to the disk surface. When the slider is closer to the disk, there is more friction and thus more heat generated. Conversely, when the slider is farther away from the disk, it is cooler. The resistance of the RTD changes with temperature, thereby enabling detection of temperature and temperature changes of the slider, which in turn is an indicator of fly height and fly height changes. Two types of RTDs that are sometimes employed in the slider of an HDD include an embedded contact sensor (ECS), which is typically configured near the read element of the slider, and a near-field temperature sensor (NTS), which is typically configured near the write element of the slider or placed near the near-field transducer used for heat-assisted magnetic recording (HAMR).

The resistance value or change in resistance value of the RTD may be detected using a direct current (DC) mode or an alternating current (AC) mode. As the names suggest, DC mode detection involves passing a direct current through the RTD and AC mode detection involves passing an alternating current through the RTD. DC mode detection is also referred to as low frequency (LF) mode detection, since direct current does not change over time and essentially has a frequency of zero or near zero, whereas AC mode detection is referred to as high frequency (HF) mode detection, since alternating current changes over time and may change suddenly. AC mode is typically used during the manufacturing phase of HDDs for its high accuracy and sensitivity when scanning for defects. DC mode is typically used during regular operation for real time feedback on fly height, as it offers a good balance of simplicity, speed, and cost-effectiveness. While some resistance detection architectures support using both AC and DC modes (i.e., a dual mode architecture), they are generally limited to using a single electrical path for monitoring and scanning. Thus, the HDD must switch between AC mode for defect scanning and DC mode for monitoring the resistance of the RTD. Moreover, while in DC mode, determining the resistance value of the RTD often requires time-consumptive averaging of a large number of individual measurements (e.g., 50+ measurements) in order to reduce the impact of low frequency noise and improve accuracy.

In accordance with aspects of this disclosure, a dual path resistance detection and monitoring architecture is provided that supports continuous dual mode (AC and DC modes) operation. Separate AC and DC paths are provided, and dual path monitoring of the AC and DC paths reduces the test time for HDDs. Aspects of this disclosure are further directed to an architecture that removes low frequency 1/f noise from the RTD bias signal by modulating ("chopping") the RTD signal to a higher frequency, demodulating the signal to a lower frequency, and filtering out the 1/f noise, thereby eliminating or substantially reducing the need for time-consumptive averaging of a large number of individual measurements. In addition, the architecture of this disclosure is configured for differential sensing of multiple RTDs, such as an ECS and an NTS. Moreover, the architecture of this disclosure is configured to automatically zero out any offset between the differential ECS and NTS bias voltages.

Some aspects of this disclosure are directed to a data storage device comprising a first RTD and a second RTD coupled to a first voltage source. A tuning bridge coupled between the first and second RTDs and a second voltage source reduces offset between a first bias voltage across the first RTD and a second bias voltage across the second RTD. An LNA receives the first and second bias voltages as a differential bias voltage. A modulator coupled between the first and second RTDs and the LNA modulates the differential bias voltage.

In some implementations, the tuning bridge comprises a first branch of switchable resistors coupled between the first RTD and the second voltage source and a second branch of switchable resistors coupled between the second RTD and the second voltage source.

In some implementations, the modulator comprises a chopping circuit comprising a plurality of switches coupled between the first and second RTDs and the LNA that are opened and closed at a carrier frequency.

In some implementations, a demodulator is coupled to the LNA to demodulate the modulated differential bias voltage, and a low pass filter is coupled to the demodulator to remove 1/f bias noise from the demodulated differential bias voltage.

In some implementations, the carrier frequency is equal to or greater than 400 kHz and a cut-off frequency of the low pass filter is less than half of the carrier frequency.

In some implementations, a high frequency (HF) path is configured to detect defects in a manufacturing process, and a low frequency (LF) path is configured to determine fly height and changes in fly height based on the differential bias voltage and changes in the differential bias voltage.

In some implementations, the HF path comprises a peak/envelope detector and the LF path comprises a comparator comparing the differential bias voltage with feedback from a successive approximation register (SAR) and a digital-to-analog converter (DAC).

In some implementations, the data storage device further comprises a slider comprising a read element and a write element. The first RTD may be an embedded contact sensor (ECS) associated with the read element, and the second RTD may be a near-field temperature sensor (NTS) associated with the write element.

In some implementations, the first voltage source controls a bias potential of the slider and the second voltage source controls a bias potential of the first and second RTDs.

Other aspects of this disclosure are directed to a method for differential sensing of bias voltages across RTDs in a data storage device. The method comprises: generating a first bias voltage across a first RTD coupled between a first voltage source and a second voltage source and a second bias voltage across a second RTD coupled between the first and second voltage sources; reducing offset between the first bias voltage and the second bias voltage; and modulating a differential bias voltage between the first RTD and the second RTD and amplifying the modulated differential bias voltage.

Additional aspects of this disclosure are directed to a circuit for differential sensing of bias voltages across RTDs in a data storage device. A first RTD and a second RTD are coupled to a first voltage source. A tuning bridge is coupled between the first and second RTDs and a second voltage source to reduce offset between a first bias voltage across the first RTD and a second bias voltage across the second RTD. An LNA receives the first bias voltage and the second bias voltage as a differential bias voltage.

Further aspects of this disclosure are directed to a data storage device comprising a first RTD coupled between a first voltage source and a second voltage source and a second RTD coupled between the first voltage source and the second voltage source. An LNA is configured to receive a first bias voltage across the first RTD and a second bias voltage across the second RTD as a differential bias voltage, and a modulator is coupled between the first and second RTDs and the LNA to modulate the differential bias voltage.

Various additional aspects of this disclosure are described below and depicted in the accompanying figures and will be further apparent based thereon.

BRIEF DESCRIPTION OF THE DRAWINGS

Various features and advantages of this disclosure will be apparent from the following description and accompanying drawings. The drawings are not necessarily to scale; emphasis instead is placed on illustrating the principles of this disclosure. In the drawings, like reference characters may refer to the same parts throughout the different views. The drawings depict only illustrative examples of this disclosure and are not limiting in scope.

FIG. 8A is a graph illustrating low frequency, high frequency, and noise components of an input voltage signal to the LNA of FIG. 7, according to aspects of this disclosure.

FIG. 8B is a graph illustrating a demodulated high frequency signal extracted from the signal of FIG. 8A, according to aspects of this disclosure.

FIG. 8C is a graph illustrating a demodulated low frequency signal extracted from the signal of FIG. 8A, according to aspects of this disclosure.

FIG. 8D is a graph showing the gain of the low frequency path, in accordance with aspects of this disclosure.

DETAILED DESCRIPTION

The words "exemplary" and "example" as used herein mean "serving as an example, instance, or illustration." Any embodiment described herein as "exemplary" or as an "example" should not be construed as preferred or advantageous over other embodiments.

The embodiments described herein do not limit the invention to the precise form disclosed, nor are they exhaustive. Rather, various embodiments are presented to provide a description for utilization by others skilled in the art. Technology continues to develop, and elements of the disclosed embodiments may be replaced by improved and enhanced items. This disclosure inherently discloses elements incorporating technology available at the time of this disclosure.

Figure 1:
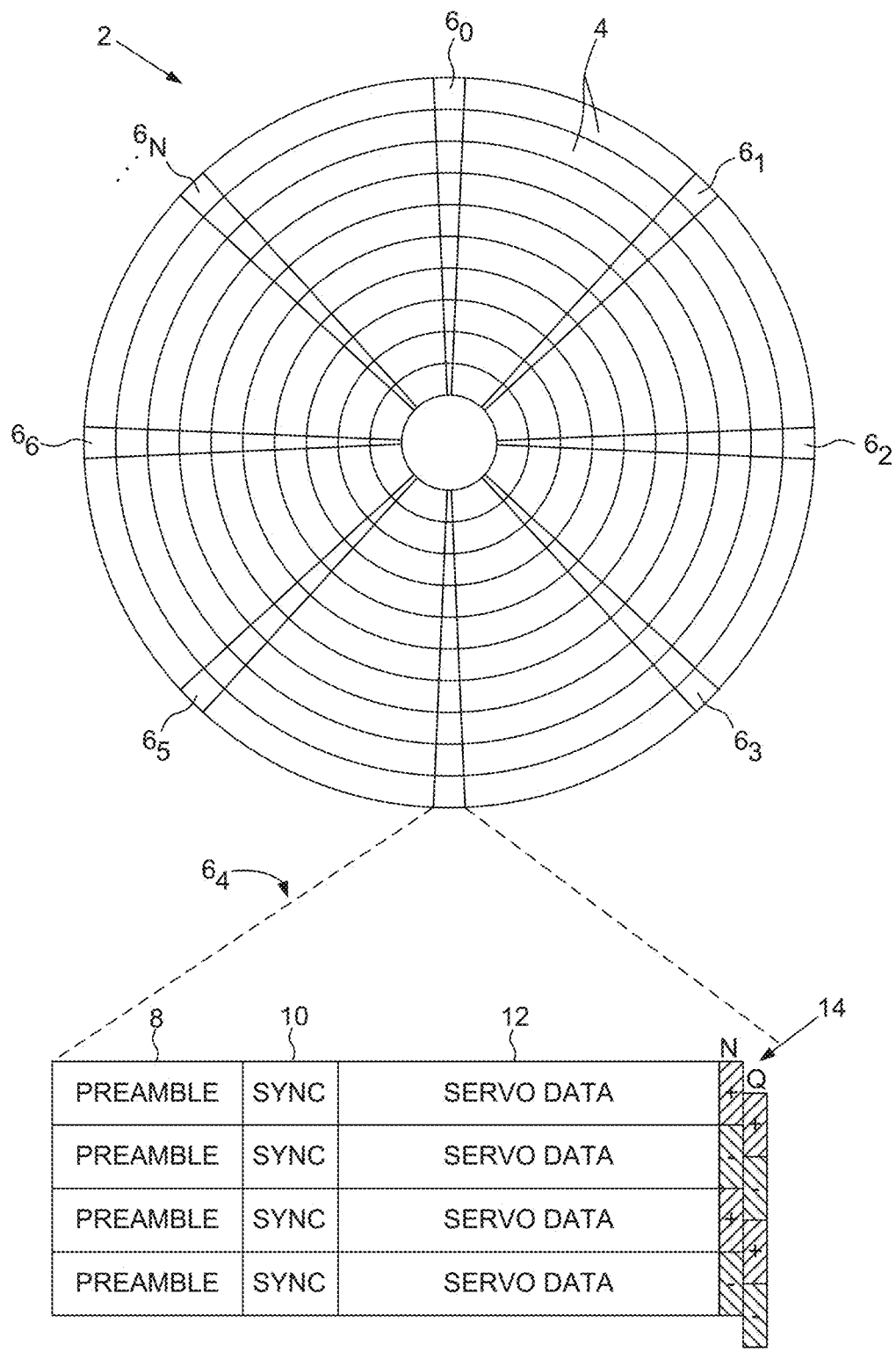
FIG. 1 is a conceptual diagram of a conventional disk format, in accordance with aspects of this disclosure.
Figure 2:
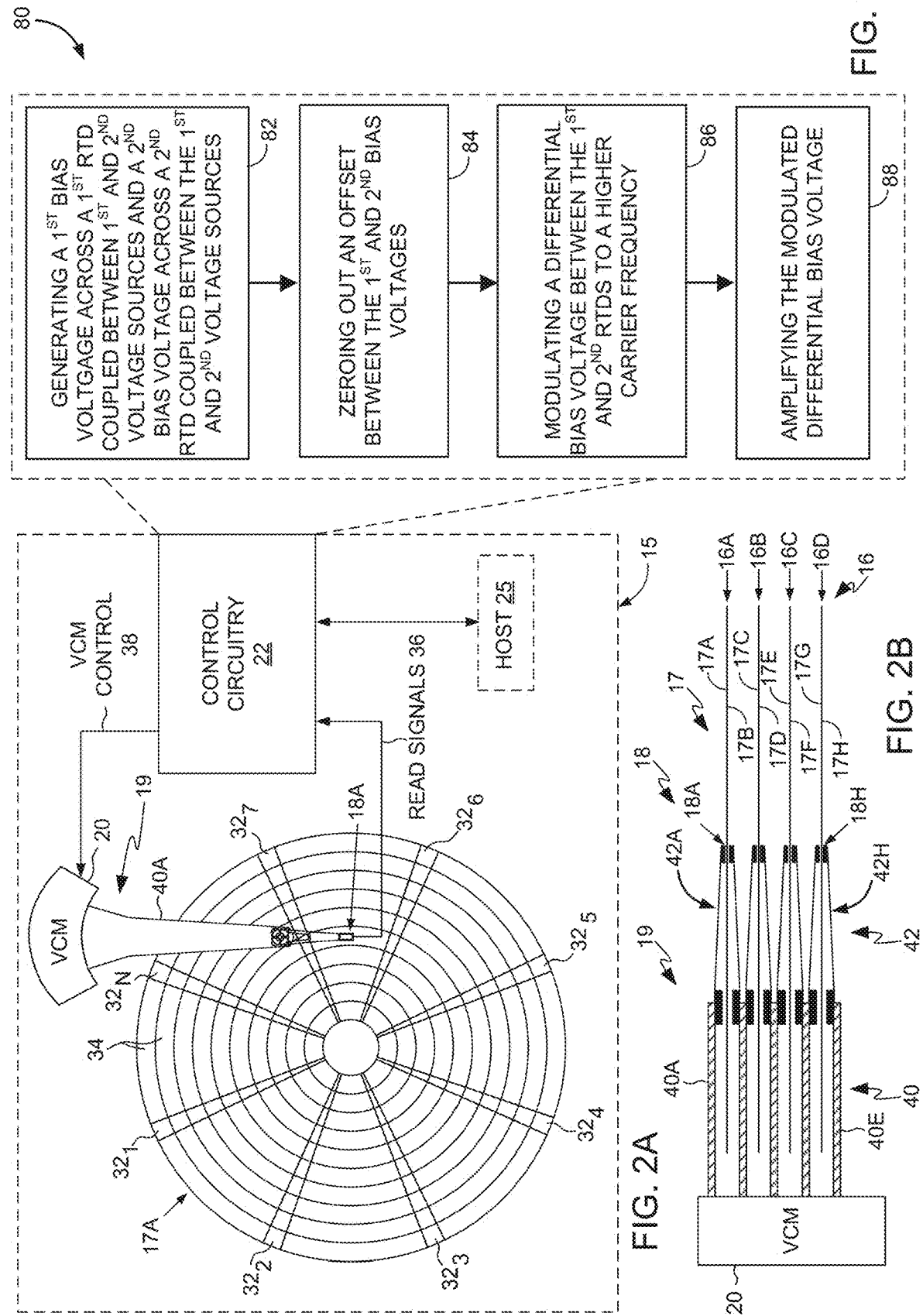
FIG. 2A is a conceptual block diagram of a top view of a data storage device in the form of a hard disk drive (HDD), in accordance with aspects of this disclosure.
FIG. 2B is a conceptual block diagram of a side view of a data storage device in the form of an HDD, in accordance with aspects of this disclosure.
FIG. 2C is a flow diagram of a method that a data storage device may perform, execute, and implement, in accordance with aspects of this disclosure.

FIGS. 2A and 2B are conceptual top and side views of a data storage device in the form of hard disk drive (HDD) 15, in accordance with aspects of this disclosure. HDD 15 comprises control circuitry 22, actuator assembly 19, and a plurality of hard disks 16 (e.g., disks 16A . . . 16D). FIG. 2C is a flow diagram of a method 80 that control circuitry 22 of HDD 15 performs or executes in controlling the operations of HDD 15, including the operations of read/write heads 18 (e.g., heads 18A . . . 18H) disposed on actuator assembly 19. In particular, method 80 is a method for differential sensing of bias voltages across resistive temperature detectors (RTDs) configured in a slider of HDD 15. In step 82, a first bias voltage is generated across a first RTD coupled between first and second voltage sources, and a second bias voltage is generated across a second RTD coupled between the first and second voltage sources. In some implementations, the first RTD is an ECS and the second RTD is an NTS. In step 84, any offset between the first and second bias voltages is zeroed out. In some implementations, the offset is zeroed out by a tuning bridge coupled between the RTDs and the second voltage source. In step 86, a differential bias voltage between the first and second RTDs is modulated to a higher carrier frequency. In some implementations, the modulation is carried out by chopping circuitry. The modulated differential bias voltage is amplified in step 88.

Actuator assembly 19 is configured to position heads 18 over surfaces 17 (e.g., surfaces 17A . . . 17H) of disks 16. Heads 18 comprise write and read elements configured for writing and reading control features and data to and from disk surfaces 17. Actuator assembly 19 comprises primary actuator 20, which is typically a voice coil motor (VCM), and a number of actuator arms 40 (e.g., actuator arms 40A . . . 40E). Each head 18 is configured at a distal end of an actuator arm 40 via a suspension 42 (e.g., suspensions 42A . . . 42H). Each actuator arm 40 is configured to suspend a head 18 in close proximity over a corresponding disk surface 17. For example, head 18A is suspended by topmost actuator arm 40A via suspension 42a over topmost disk surface 17A, and head 18H is suspended by lowest actuator arm 40H via suspension 42H over lowest disk surface 17H). FIGS. 2A-2B are presented for exemplary purposes only; a wide variety of other numbers of disks, disk surfaces, primary actuators, actuator assemblies, suspensions, and heads are contemplated and may be used.

FIG. 2A also depicts servo sectors 32 (e.g., servo sectors $32_1 \ldots 32_N$) written onto disk surfaces 17 (e.g., disk surface 17A) to define a plurality of evenly-spaced, concentric tracks 34. Each servo sector 32 may include a phase lock loop (PLL) field, a servo sync mark (SSM) field, a track identification (TKID) field, a sector ID, and a group of servo bursts (an alternating pattern of magnetic transitions) that the servo system of HDD 15 samples to align a head 18 with and relative to a particular track 34. Servo sectors 32 are spaced sequentially around the circumferences of tracks 34 and extend radially outward from the inner diameter of disk surfaces 17. Data is conventionally written in data regions in a plurality of discrete data sectors. Each data region is typically preceded by a servo sector 32.

Control circuitry 22 processes read signals 36 emanating from heads 18 (e.g., head 18A) to demodulate servo data written on the disk (e.g., servo sectors 32) to generate a position error signal (PES) representing an error between the actual position of the head and a target position relative to a target track. Control circuitry 22 processes the PES using a suitable servo control system to generate VCM control signal 38 that is applied to VCM 20, which rotates actuator arm 40 about a pivot to actuate head 18 radially over disk surface 17 in a direction that reduces the PES. In some examples, HDD 15 may also comprise a suitable micro actuator, such as a piezoelectric element, for actuating head 18 relative to a suspension 42, or for actuating a suspension 42 relative to actuator arm 40. Host 25 may be a computing device such as a desktop computer, laptop, server, mobile computing device (e.g., smartphone, tablet, etc.), or any other suitable computing device. Alternatively, host 25 may be a test computer that performs calibration and testing functions as part of the HDD manufacturing process.

Figure 3:
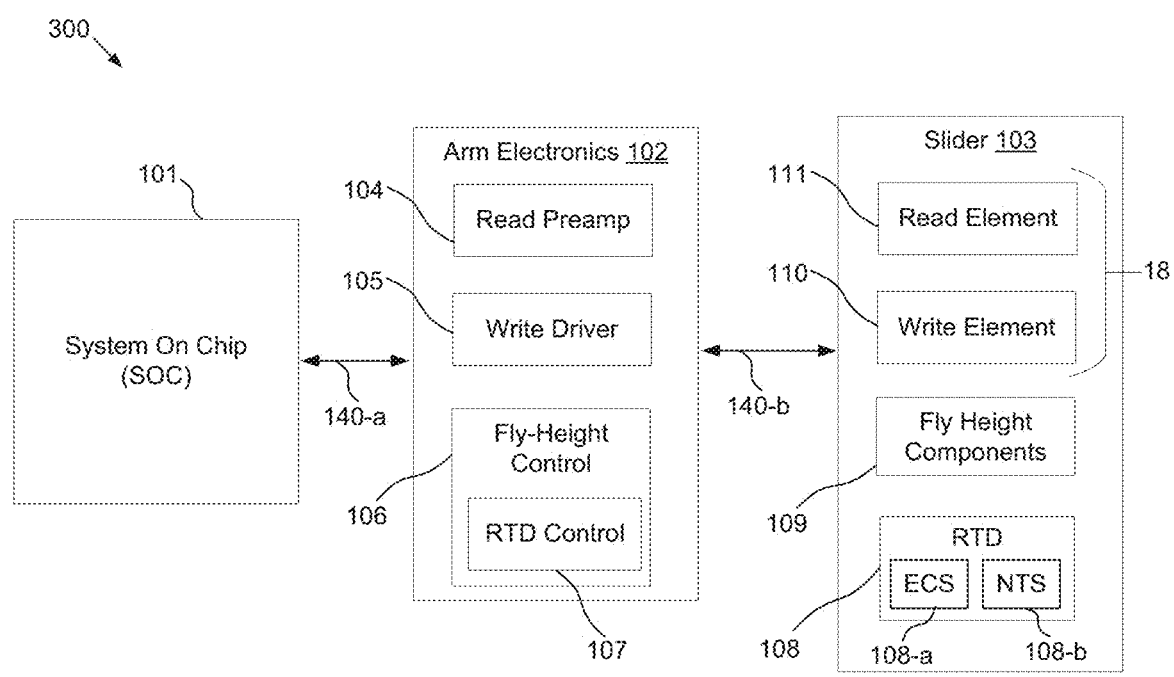
FIG. 3 is a conceptual block diagram illustrating additional components of an HDD, in accordance with aspects of this disclosure.

As described above, with reference to FIG. 2B, heads 18 are positioned at the ends of suspensions 42. FIG. 3 is a conceptual block diagram illustrating additional components of HDD 15, in accordance with aspects of this disclosure. As shown in FIG. 3, each head 18 includes a read element 111 configured to read data from a disk 16, and a write element 110 configured to write data to disk 16. Each read/write element pair is packaged within a component known as a slider (slider 103) that is positioned at a trailing edge of suspension 42. As disk 16 spins at high speed, slider 103 is lifted or 'flies' above disk 16. It hovers on a thin layer of air at a distance measured in nanometers from disk surface 17. This minuscule distance permits read element 111 and write element 110 to retrieve or store data while avoiding direct physical contact with disk surface 17, thereby preventing data corruption and potential damage to disk surface 17.

Ever-growing demands for increased data density dictate that read element 111 and write element 110 fly as close as possible to disk surface 17. Thus, accurate control and monitoring of the spacing or "fly height" between read and write elements 111 and 110 of slider 103 and disk surface 17 is an important aspect of HDD design. Fly height components 109 may be disposed in slider 103 to control and adjust the fly height. In some examples, fly height components 109 comprise thermal fly height control (TFC) devices such as heaters disposed near the read and write elements. Electrical current supplied to the heaters by fly height control circuitry 106 generates heat to thermally expand the slider and modulate fly height. Fly height components 109 may also include elements in addition to or other than heaters.

To verify fly height, the amplitude of the read-back signal and a Wallace spacing loss relationship have sometimes been used. However, the read-back signal measurement may not always provide an accurate fly height. With the slider flying as close as possible to the disk, slider-disk contact may occur and create unstable slider-fly dynamics, which in turn may create data imprint errors in the disk.

Alternatively, resistive temperature detectors (RTDs) are sometimes used to monitor and measure fly height by leveraging temperature-dependent properties of the RTD material. The basic principle behind using an RTD to monitor fly height is that the temperature of the RTD changes with its proximity to the disk surface. When the slider (which is also heated by the TFC) is closer to the disk, there is more friction and thus more heat generated. Conversely, when the slider is farther away from the disk, it is cooler. The resistance of the RTD changes with temperature, thereby enabling detection of temperature and temperature changes of the slider, which in turn is an indicator of fly height and fly height changes. In some examples, the RTD comprises a thermal strip, such as a metallic or semiconductor strip, embedded in the slider. Non-limiting examples of RTDs that are sometimes employed in the slider of an HDD include an embedded contact sensor (ECS), which is typically configured near the read element and air-bearing surface (ABS) of the slider, and a near-field temperature sensor (NTS), which is typically configured near the write element and ABS of the slider or near the near-field transducer that is used in HAMR. Other examples may use distributed RTDs such as a first RTD that is located relatively near the ABS and a second RTD that is offset from the ABS. Fly height and slider-disk contact may be determined based on differences in temperature measured by the first and second RTDs. In some cases, the first and second RTDs may form a bridge circuit, such as a half circuit of a Wheatstone bridge, allowing the temperature of the read/write head to be accurately measured.

In one non-limiting example, as shown in FIG. 3, slider 103 comprises one or more RTDs 108, such as ECS 108-a configured near read element 111. Where HDD 15 is configured for HAMR operation, NTD 108-b is also configured near write element 110. RTD 108 facilitates detection of disk contact or changes in fly height since the resistance value of RTD 108 changes as a function of temperature. If slider 103 physically contacts disk surface 17, heat generated from the friction between slider 103 and disk surface 17 increases the resistance of RTD 108. Changes in fly height also change the temperature and thus the resistance of RTD 108. The temperature of RTD 108 may also be altered by air cooling effects that can be accounted for by a rate of change (slope) in temperature changes in RTD 108. Accordingly, as fly height changes, temperature changes, and the resistance of RTD 108 changes. Real time write element and read element fly height and contact may thereby be detected by passing a bias current through RTD 108 and detecting changes in the bias voltage across RTD 108 (V=IR).

Fly height is also affected by lubricant-slider interaction, such as lube pickup, and electrostatic force. Negative effects of lubricant-slider interaction and electrostatic force may be diminished or eliminated by controlling the slider voltage potential with respect to the disk voltage potential. Thus, controlling the slider voltage potential both reduces slider wear and allows for lower flying heights. Controlling the slider voltage potential can also facilitate other features such as fly height modulation, active damping, pre-contact detection, fly height measurement and control, disk defect mapping, and high frequency detection for additional spacing feedback information.

Referring again to FIG. 3, control circuitry 22 of HDD 15 may comprise a primary integrated circuit or system-on-a-chip (SOC) 101 and arm electronics (AE) 102. SOC 101 comprises much of the electronics and firmware that controls the functions of HDD 15, including providing power and control signals to arm electronics (AE) 102 via first connection (flex cable) 140-a. AE 102 may be configured in actuator assembly 19 and may facilitate electrical connections to components of slider 103 via second connection (flex cable) 140-b. AE 102 comprises preamp 104 for read element 111, write driver 105 for write element 110, and fly height control circuitry 106. Fly height control circuitry 106 comprises RTD control circuit 107 for controlling RTDs 108. Some components of AE 102 may be partially or wholly implemented in SOC 101. AE 102 typically includes digital and analog circuitry that controls signals sent to components in slider 103 and processes signals received from components in slider 103. AE 102 may include registers that are set using serial data from SOC 101 to provide parameters for functions of AE 102. While AE 102 is shown as including preamp 104, AE 102 inclusive of some or all of the functional blocks above other than preamp 104 may be implemented together in a preamp IC, and AE 102 may be referred to as a preamp IC. It is noted that while AE 102 is so named as the components are generally placed at the arm actuators in various embodiments, the actual physical location may vary in other embodiments.

Thus, HDD 15 is configured to detect real time slider fly height or disk contact based on temperature changes of RTD(s) 108. As fly height or disk contact heats RTD 108, the resistance of RTD 108 increases and the voltage across RTD 108 thereby increases as described above. In some examples, a bias voltage is placed across the nodes or terminals of RTD 108, such that real time resistance changes of RTD 108 (and thus temperature changes) can be detected via changes in the bias voltage. In some examples, slider bias potential can be controlled via RTD 108. In some examples, RTD 108 can be driven in a common mode (DC) on its nodes. For example, a DC slider bias voltage in common mode can be added to a differential mode across the RTD nodes electrically coupled to the slider. In some examples, RTD 108 can be driven in common mode and using an alternating bias (AC) configuration. For example, an AC slider bias voltage may be applied across the nodes of RTD 108. In some examples, an increase of AC bias allows for AC dithering in a pre-contact procedure (at about 250 kHz, for example), which may be used to determine ABS stiffness. In some examples, shunting at slider 103 is at a wafer level and can be combined with resistor connections in the slider. Additional details for generating and controlling slider bias potential are described in relation to FIGS. 4A and 4B.

Figure 4A:
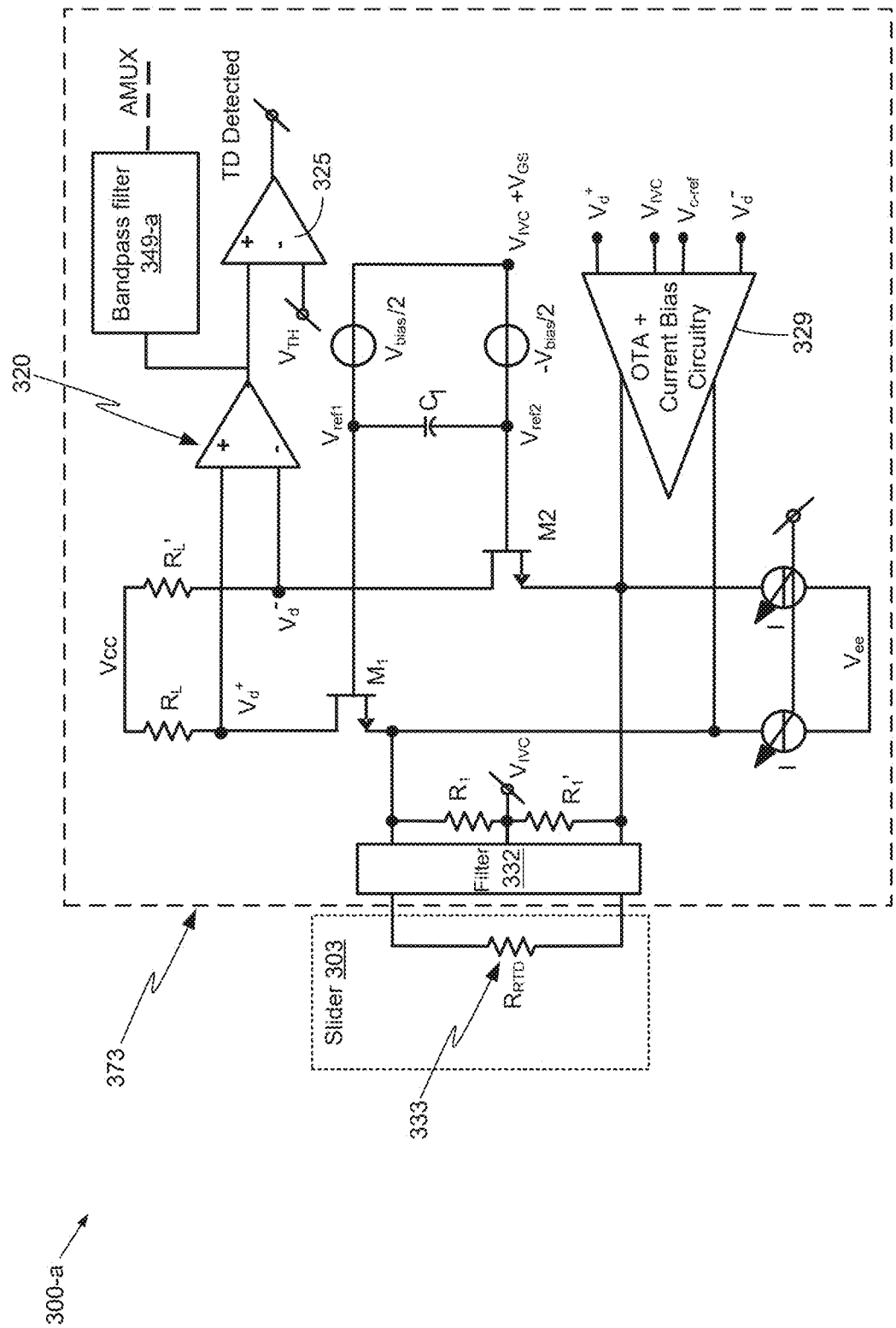
FIG. 4A is a schematic diagram of a resistive temperature detector (RTD) amplifier having a common gate topology, in accordance with aspects of this disclosure.
Figure 4B:
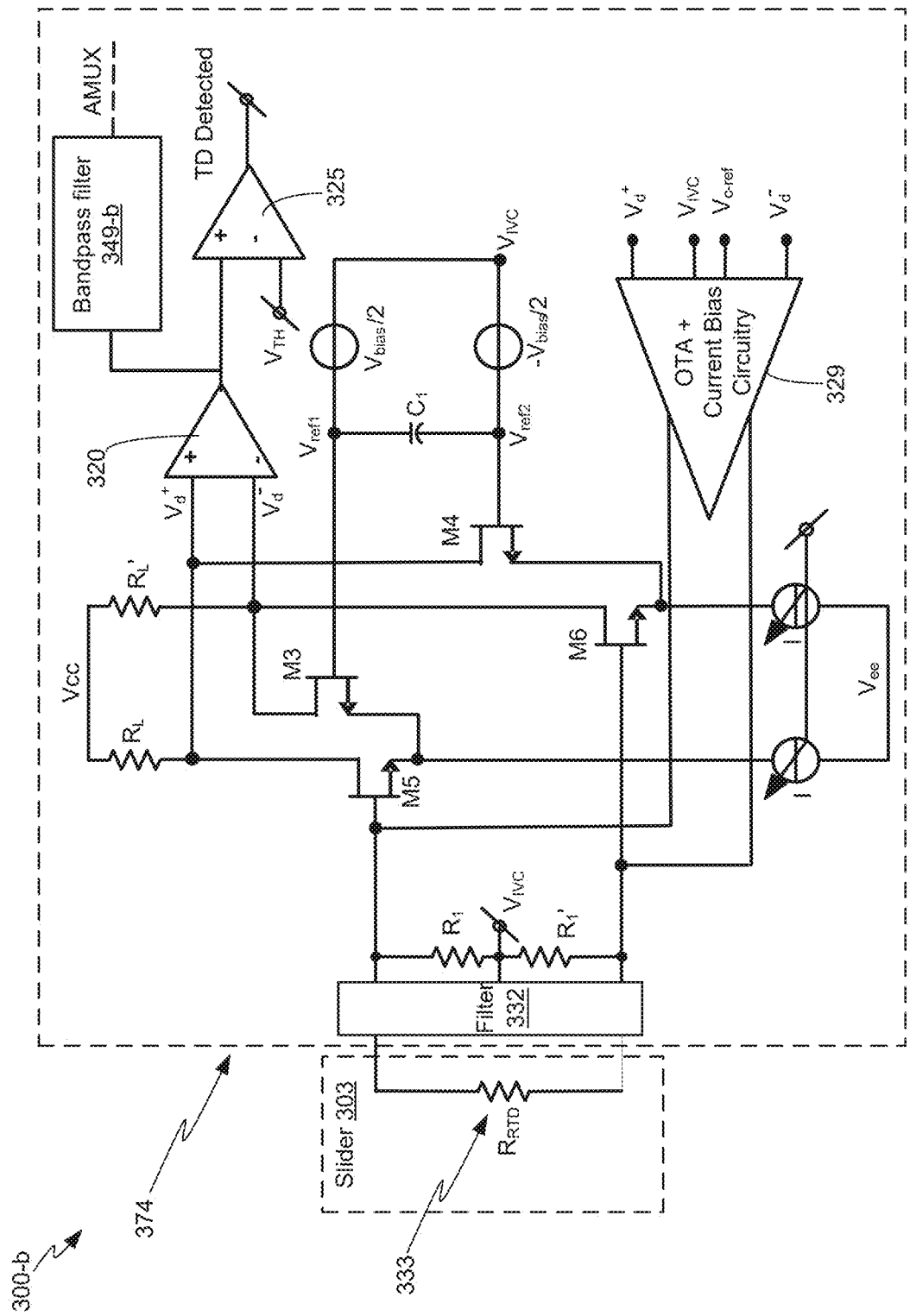
FIG. 4B is a schematic diagram of an RTD amplifier having a common source topology, in accordance with aspects of this disclosure.

The monitored RTD bias voltage may be coupled to a signal amplifier to improve the accuracy, sensitivity, and reliability of fly height measurements that are derived from the bias voltage. FIGS. 4A and 4B illustrate two non-limiting examples of signal amplifier topology options. FIG. 4A is a schematic diagram 300-a illustrating a signal amplifier 373 having a common gate topology, and FIG. 4B is a schematic diagram 300-b illustrating a signal amplifier 374 having a common source topology, in accordance with aspects of this disclosure. In this regard, FIGS. 4A and 4B are presented for exemplary purposes only, and do not limit the scope of this disclosure. Other signal amplifier topologies are contemplated and may be suitable for use with the embodiments disclosed herein.

Referring first to the common gate topology option of FIG. 4A, signal amplifier 373 is typically located within control circuitry 22 such as, for example, SOC 101 and/or AE 102 of FIG. 3. Signal amplifier 373 is one non-limiting example of a low impedance amplifier. RTD 333 having resistance $R_{RTD}$ is configured proximate the read/write head and air bearing surface (ABS) of slider 303, and the bias voltage across RTD 333 is coupled to signal amplifier 373. In some examples, RTD 333 may be an embedded contact sensor (ECS), typically configured near the read element of slider 303, or a near-field temperature sensor (NTS), typically configured near the write element of slider 303. In a slider configured for HAMR, both an ECS and an NTS are present, and RCS 333 is representative of either or both the ECS and NTS. RTD 333 is coupled to signal amplifier 373 via pre-filter 332, which reduces bandwidth (e.g., cross-talk) of the RTD voltage signal.

Signal amplifier 373 comprises differential operational transconductance amplifier (OTA) 329 having the following inputs: differential voltages $V_d+$ and $V_d-$, common mode voltage $V_{c-ref}$, and slider potential $V_{IVC}$. The differential outputs of OTA 329 are coupled across RTD 333 via filter 332. Resistors $R_1$ and $R_1'$ are coupled in series between the differential outputs of OTA 329. The slider potential voltage $V_{IVC}$ between resistors $R_1$ and $R_1'$ is fed back as an input to OTA 329. Current sources I are coupled between the differential outputs of OTA 329 and $V_{ee}$. In some non-limiting examples, $V_{ee}$ may be −3V, and in other non-limiting examples, $V_{ee}$ may be 0V. OTA 329 includes current bias circuitry that operates to push and pull the current through RTD 333. The current bias circuitry associated with OTA 329 is not shown separately in FIG. 4A, but is broken out separately as current bias circuitry 450 in FIG. 5A.

Signal amplifier 373 further comprises transistors M1 and M2. In some examples, as illustrated in FIG. 4A, M1 and M2 are MOSFETS arranged in a common gate topology. In particular, voltage sources $V_{bias}/2$ and $-V_{bias}/2$ are coupled to the respective gates of M1 and M2. Capacitor $C_1$ is coupled between the gates of M1 and M2, and between voltage sources $V_{bias}/2$ and $-V_{bias}/2$. The node between the gate of M1 and voltage source $V_{bias}/2$ has a voltage $V_{ref1}$, and the node between the gate of M2 and voltage source $-V_{bias}/2$ has a voltage $V_{ref2}$. Each of the voltage sources $V_{bias}/2$ and $-V_{bias}/2$ is coupled between a respective gate of M1 or M2 and a node having a voltage that is the sum of the slider potential $V_{IVC}$ and the gate-source voltage $V_{GS}$. The sources of M1 and M2 are coupled to current sources I and to the differential outputs of OTA 329. Resistors $R_L$ and $R_L'$ are coupled between the respective drains of M1 and M2 and $V_{cc}$. In some non-limiting examples, $V_{cc}$ may be 5V, and in other non-limiting examples, $V_{cc}$ may be 0V. The drain of M1 has a voltage $V_d+$ that is fed back as differential voltage $V_d+$ to OTA 329, and the drain of M2 has a voltage $V_d-$ that is fed back as differential voltage $V_d-$ to OTA 329.

The drains of M1 and M2 are also coupled to the respective positive and negative inputs of buffer amplifier 320, such that the differential voltages $V_d+$ and $V_d-$ are input to the positive and negative inputs of buffer amplifier 320. The output of buffer amplifier 320 is fed through bandpass filter 349-a, and the output of bandpass filter 349-a is one output of signal amplifier 373. The high frequency of bandpass filter 349-a is dictated or programmable by the loop gain of the OTA 329 feedback loop (see, e.g., gain curve 540 of FIG. 5B). The output of buffer amplifier 320 is also fed to the positive input of threshold detector 325 for comparison with a programmable reference voltage $V_{TH}$ for purposes of touchdown (TD), or head-disk contact, detection.

In operation, the RTD bias voltage $V_{bias}$ is imposed across the bases of M1 and M2 by voltage sources $V_{bias}/2$ and $-V_{bias}/2$. The feedback to OTA 329 forces $V_{bias}$ across RTD 333. In some examples, a plurality of additional resistances (not shown) may be coupled to RTD 333 (e.g., at each end of RTD 333). Such additional resistances may be coupled to slider 303, such that there is a coupling from the common mode input $V_{c-ref}$ to OTA 329 to slider 303. In some examples, slider potential is controlled by controlling a voltage in slider 303 through such additional resistances. An additional feedback may be created by sensing $V_{IVC}$ between the series coupling of resistors $R_1$ and $R_1'$ and feeding $V_{IVC}$ back to OTA 329. $V_{c-ref}$ is compared to $V_{IVC}$, forcing $V_{c-ref}$ to be equivalent to $V_{IVC}$. In such cases, $V_{c-ref}$ is effectively a programmable interface voltage control ($V_{IVC}$) for controlling signal amplifier 373.

In some examples, the RTD bias voltage $V_{BIAS}$ may be controlled by setting the common mode voltage $V_{c-ref}$ at OTA 329. In some examples, there may be a differential mode for RTD 333 and a common mode control for the voltage in slider 303. In some cases, both modes may be operated at the same time. In some examples, resistances $R_L$ and $R_L'$, and resistances $R_1$ and $R_1'$, may be matched. In some cases, when a DC voltage is applied between the gates of OTA 329, it behaves as a differential OTA with common mode.

FIG. 4B is a schematic diagram 300-b illustrating a signal amplifier 374 having a common source (or quad common source topology). Signal amplifier 374 of FIG. 4B is configured in the same fashion as signal amplifier 373 of FIG. 4A, with the exception of the common source topology of transistors M3-M6. Signal amplifier 374 is typically located within control circuitry 22 such as, for example, SOC 101 and/or AE 102 of FIG. 3. Signal amplifier 374 is one non-limiting example of a high impedance amplifier.

RTD 333 having resistance $R_{RTD}$ is configured proximate the read/write head and air bearing surface (ABS) of slider 303, and the bias voltage across RTD 333 is coupled to signal amplifier 374. In some examples, RTD 333 may be an ECS, typically configured near the read element of slider 303, or an NTS, typically configured near the write element of slider 303. In a slider configured for HAMR, both an ECS and an NTS are present, and RCS 333 is representative of either or both the ECS and NTS. RTD 333 is coupled to signal amplifier 374 via pre-filter 332, which reduces bandwidth (e.g., cross-talk) of the RTD voltage signal.

Signal amplifier 374 comprises differential operational transconductance amplifier (OTA) 329 having the following inputs: differential voltages $V_d+$ and $V_d-$, common mode voltage $V_{c-ref}$, and slider potential $V_{IVC}$. The differential outputs of OTA 329 are coupled across RTD 333 via filter 332. Resistors $R_1$ and $R_1'$ are coupled in series between the differential outputs of OTA 329. The slider potential voltage $V_{IVC}$ between resistors $R_1$ and $R_1'$ is fed back as an input to OTA 329. First and second current sources I are coupled between the differential outputs of OTA 329 and $V_{ee}$. In some non-limiting examples, $V_{ee}$ may be −3V, and in other non-limiting examples, $V_{ee}$ may be 0V. OTA 329 includes current bias circuitry that operates to push and pull the current through RTD 333. The current bias circuitry associated with OTA 329 is not shown separately in FIG. 4A, but is broken out separately as current bias circuitry 450 in FIG. 5A.

Signal amplifier 374 further comprises transistors M3, M4, M5, M6 arranged in a differential cross-coupled pair configuration. In some examples, as illustrated in FIG. 4B, M3-M6 are MOSFETS arranged in a quad common source topology. Voltage sources $V_{bias}/2$ and $-V_{bias}/2$ are coupled to the respective gates of M3 and M4 and dictate the currents that come through the drains of M3 and M4. Capacitor C, is coupled between the gates of M3 and M4, and between voltage sources $V_{bias}/2$ and $-V_{bias}/2$. The node between the gate of M3 and voltage source $V_{bias}/2$ has a voltage $V_{ref1}$, and the node between the gate of M4 and voltage source $-V_{bias}/2$ has a voltage $V_{ref2}$. Each of the voltage sources $V_{bias}/2$ and $-V_{bias}/2$ is coupled between a respective gate of M3 or M4 and a node having voltage $V_{IVC}$. The sources of M3 and M5 are coupled to the first current source I, and the sources of M4 and M6 are coupled to the second current source I. The gates of M5 and M6 are coupled to the differential outputs of OTA 329. Resistor $R_L$ is coupled between the respective drains of M4 and M5 and $V_{cc}$, and resistor $R_L'$ is coupled between the respective drains of M3 and M6 and $V_{cc}$. In some non-limiting examples, $V_{cc}$ may be 5V, and in other non-limiting examples, $V_{cc}$ may be 0V. The drains of M4 and M5 have a voltage $V_d+$ that is fed back as differential voltage $V_d+$ to OTA 329, and the drains of M3 and M6 have a voltage $V_d-$ that is fed back as differential voltage $V_d-$ to OTA 329.

The drains of M4 and M5 are coupled to the positive input of buffer amplifier 320, and the drains of M3 and M6 are coupled to the negative input of buffer amplifier 320, such that the differential voltages $V_d+$ and $V_d-$ are input to the respective positive and negative inputs of buffer amplifier 320. The output of buffer amplifier 320 is fed through high pass filter 349-a, and the output of high pass filter 349-a is one output of signal amplifier 374. The output of buffer amplifier 320 is also fed to the positive input of threshold detector 325 for comparison with a programmable reference voltage $V_{TH}$ for purposes of touchdown (TD), or head-disk contact, detection.

In operation, the RTD bias voltage $V_{bias}$ is imposed across the bases of M3 and M4 by voltage sources $V_{bias}/2$ and $-V_{bias}/2$. The feedback to OTA 329 forces $V_{bias}$ across RTD 333. In some examples, a plurality of additional resistances (not shown) may be coupled to RTD 333 (e.g., at each end of RTD 333). Such additional resistances may be coupled to slider 303, such that there is a coupling from the common mode input $V_{c-ref}$ to OTA 329 to slider 303. In some examples, slider potential is controlled by controlling a voltage in slider 303 through such additional resistances. An additional feedback may be created by sensing $V_{IVC}$ between the series coupling of resistors $R_1$ and $R_1'$ and feeding $V_{IVC}$ back to OTA 329. $V_{c-ref}$ is compared to $V_{IVC}$, forcing $V_{c-ref}$ to be equivalent to $V_{IVC}$. In such cases, $V_{c-ref}$ is effectively a programmable interface voltage control ($V_{IVC}$) for controlling signal amplifier 374.

In some examples, the RTD bias voltage $V_{BIAS}$ may be controlled by setting the common mode voltage $V_{c-ref}$ at OTA 329. In some examples, there may be a differential mode for RTD 333 and a common mode control for the voltage in slider 303. In some cases, both modes may be operated at the same time. In some examples, resistances $R_L$ and $R_L'$, and resistances $R_1$ and $R_1'$, may be matched. In some cases, when a DC voltage is applied between the gates of OTA 329, it behaves as a differential OTA with common mode.

Figure 5A:
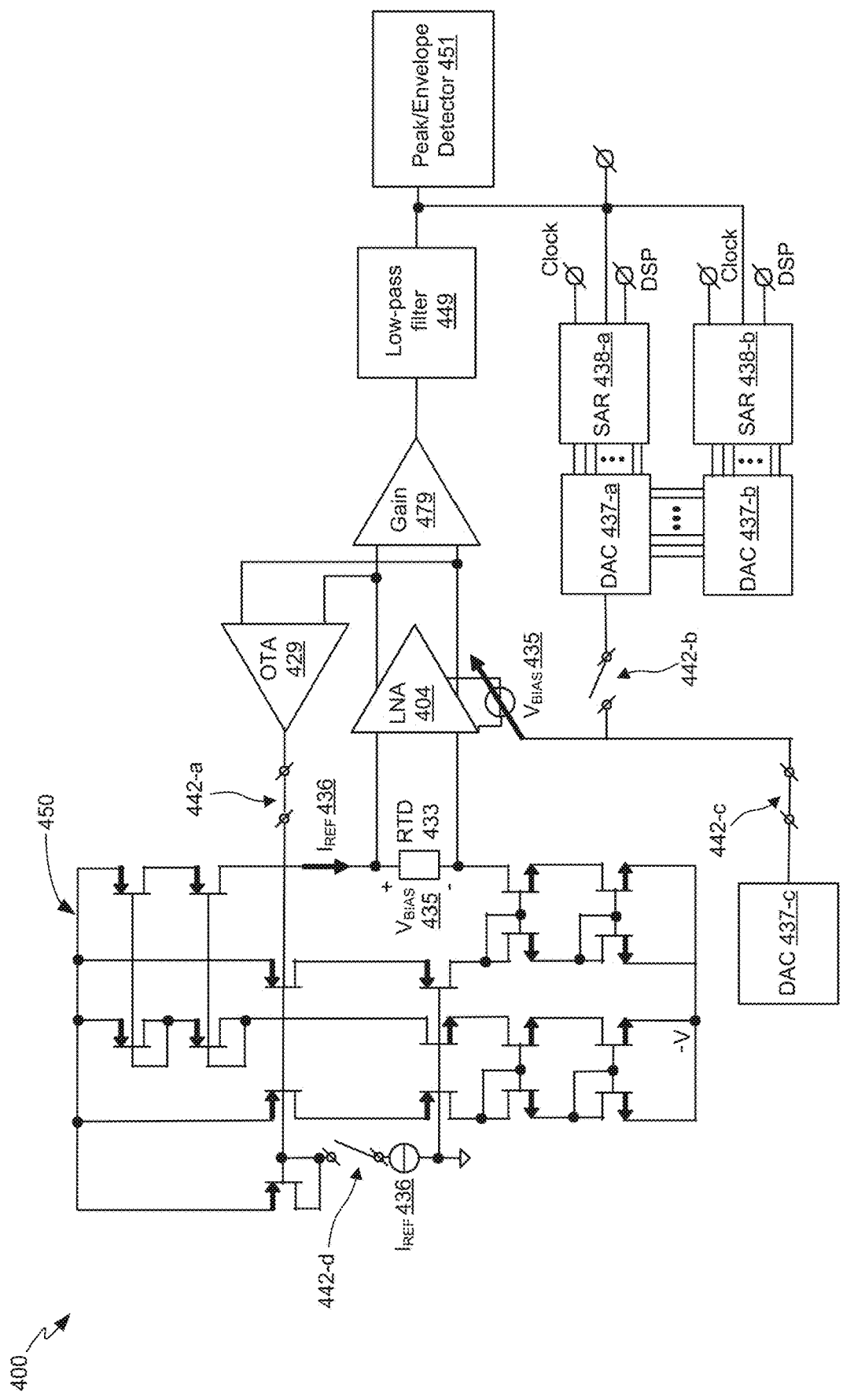
FIG. 5A is a schematic diagram of a single path resistance detection circuit supporting dual mode monitoring, in accordance with aspects of this disclosure.
Figure 5B:
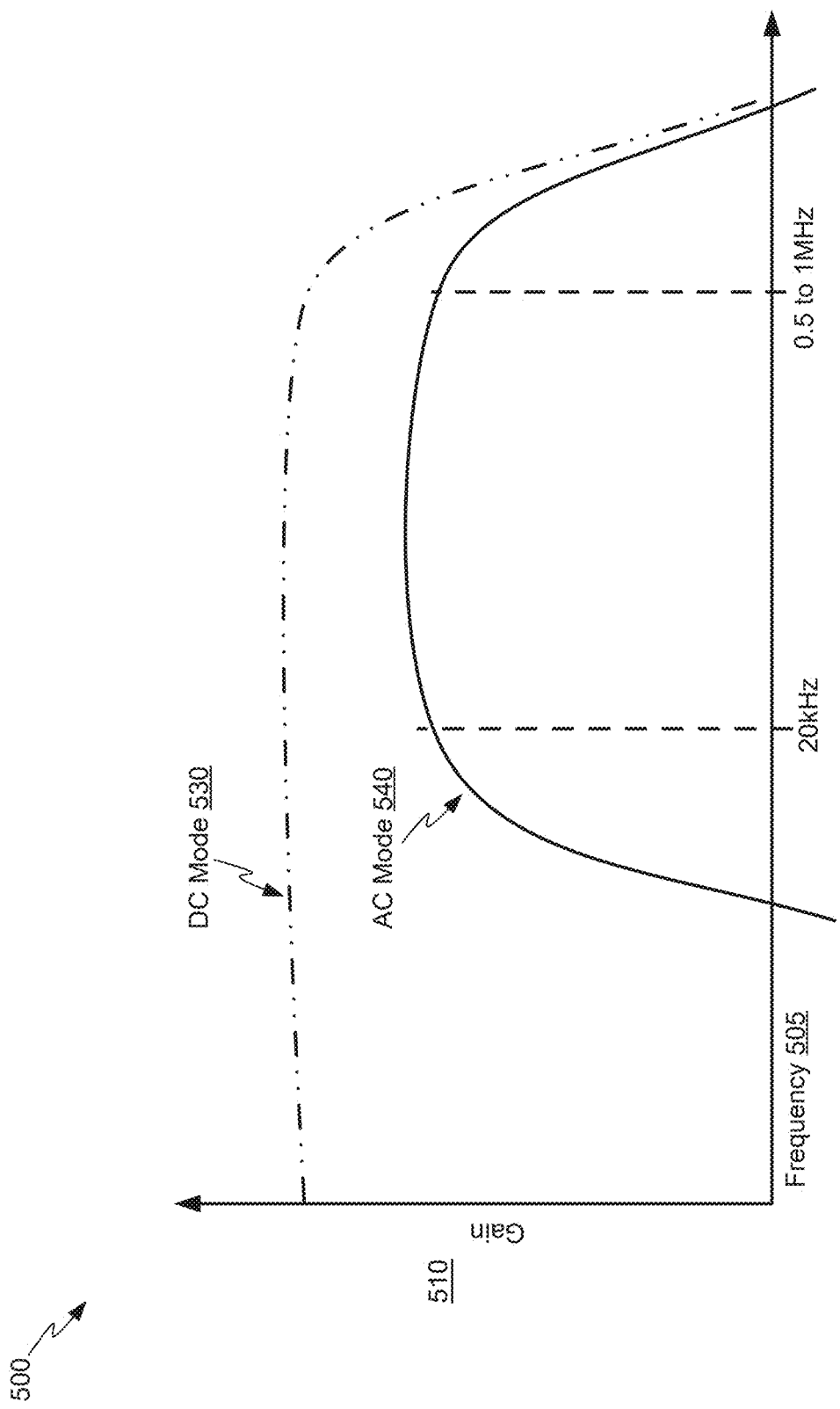
FIG. 5B is a graph depicting gain against frequency for DC and AC modes in the circuit of FIG. 5A, in accordance with aspects of this disclosure.

FIG. 5A is a schematic diagram 400 of a single path resistance detection circuit supporting dual mode (AC and DC modes) monitoring that incorporates a signal amplifier having, in some examples, the common gate architecture 373 of FIG. 4A or the common source architecture 374 of FIG. 4B. FIG. 5B is a graph 500 depicting gain 510 against frequency 505 for the AC and DC modes of FIG. 5A. Specifically, FIG. 5B depicts gain waveforms for DC mode 530 and AC mode 540. As used herein, the term "single path" means that only one of the two modes (AC and DC modes) can be monitored at a given time. Circuit 400 comprises switches 442-a, 442-b, 442-c, and 442-d; RTD 433 having resistance $R_{RTD}$; low noise amplifier (LNA) 404; OTA 429; current bias circuitry 450; gain amplifier 479; low pass filter (LPF) 449; peak/envelope detector 451; and one or more digital-to-analog converters (DACs), such as DAC 437-a, DAC 437-b, and DAC 437-c. In FIG. 5, LNA 404 has either a common gate topology such as that shown in FIG. 4A, or a common source topology such as that shown in FIG. 4B. OTA 429 corresponds to OTA 329 of FIGS. 4A-4B, with the exception that current bias circuitry 450 associated with OTA 429 is shown as broken out separately in FIG. 5A, whereas the current bias circuitry is shown as incorporated in (i.e., not broken out separately) OTA 329 of FIGS. 4A-4B. In some examples, DAC 437-a and successive approximation register (SAR) 438-a may determine $R_{RTD}$ based on the biasing voltage ($V_{BIAS}$ 435) and the reference current ($I_{REF}$ 436), where $I_{REF}$ 436 is generated by a controlled current source.

In AC (HF) mode, switches 442-a and 442-c are closed, and switches 442-b and 442-d are open (as shown in FIG. 4), which allows for defect scanning. In defect scanning, signal spikes may be detected in the HF response during manufacturing, which facilitates identification of defects on the disk's surface. In AC mode, with switches 442-a and 442-c closed and switches 442-b and 442-d open, a feedback loop comprising LNA 404, OTA 429, current bias circuitry 450, and RTD 433 leads to the high pass response shown by AC mode curve 540 of FIG. 5B, with OTA 429 zeroing out or reducing the DC offset from LNA 404 and $V_{BIAS}$ being set by DAC 437-c.

In DC (LF) mode, switches 442-b and 442-d are closed, and switches 442-a and 442-c are open, which breaks the AC feedback loop and cuts out the feedback of OTA 429 and current bias circuitry 450. DAC 437-c is also cut out in DC mode. In DC mode, a DC reference current $I_{REF}$ is imposed across RTD 433. The SAR-DAC circuitry comprising DAC 437-a and SAR 438-a performs digital processing to determine the resistance $R_{RTD}$ of RTD 433 and to lock the biasing voltage $V_{BIAS}$ with a constant current $I_{REF}$, where $V_{BIAS}$ is imposed across RTD 433 by $I_{REF}$. In some examples, an additional parallel loop comprising DAC 437-b and SAR 438-b determines a fine offset corresponding to a delta or change in the resistance $R_{RTD}$ of RTD 433. As noted above, because of noise issues, particularly low frequency 1/f noise issues, extraction of the LF (DC) resistance $R_{RTD}$ of RTD 433 may require numerous averages (e.g., 50+ averages), which is computationally expensive and time consumptive.

In a HAMR configuration, where both an ECS (sensing near the read element) and an NTS (sensing near the write element) are used, the ECS and the NTS will each have its own single path resistance detection circuit such as that shown in FIG. 5A, and differential sensing is done by subtracting the single path sense of the ECS resistance detection circuit from the single path sense of the NTS resistance detection circuit (or vice versa). Aspects of this disclosure are directed to a dual path monitoring architecture that supports continuous dual mode (AC and DC modes) operation and reduces the amount of averaging required to extract the LF (DC) RTD resistance value. Reduction of the amount of averaging that is required facilitates real-time or substantially real-time feedback on the fly-height of the slider. In addition, in a HAMR configuration, the dual path and dual mode monitoring architecture of this disclosure allows for continuous, differential sensing of the ECS and the NTS without the need for single path senses of the ECS and the NTS resistance detection circuits (as shown in FIG. 5A) and subtraction of the single path senses.

As mentioned above, in some circumstances, DC/LF fly height transducer measurements are prone to noise degradation. Specifically, if the bias signal ($V_{BIAS}$ 435) is either slowly varying or otherwise constant (essentially a DC signal), then 1/f noise typically overwhelms the signal, as further described below in relation to FIG. 6. 1/f noise is a type of noise that occurs at low frequencies, where the noise power is inversely proportional to the frequency. As used herein, low frequency or a low frequency signal refers to a frequency or signal that is under 100 kHz. Aspects of this disclosure are directed to chopping or modulating the RTD bias signal, such that the signal that is read back from the RTD is modulated to a frequency sufficiently high to reduce the 1/f noise.

Figure 6:
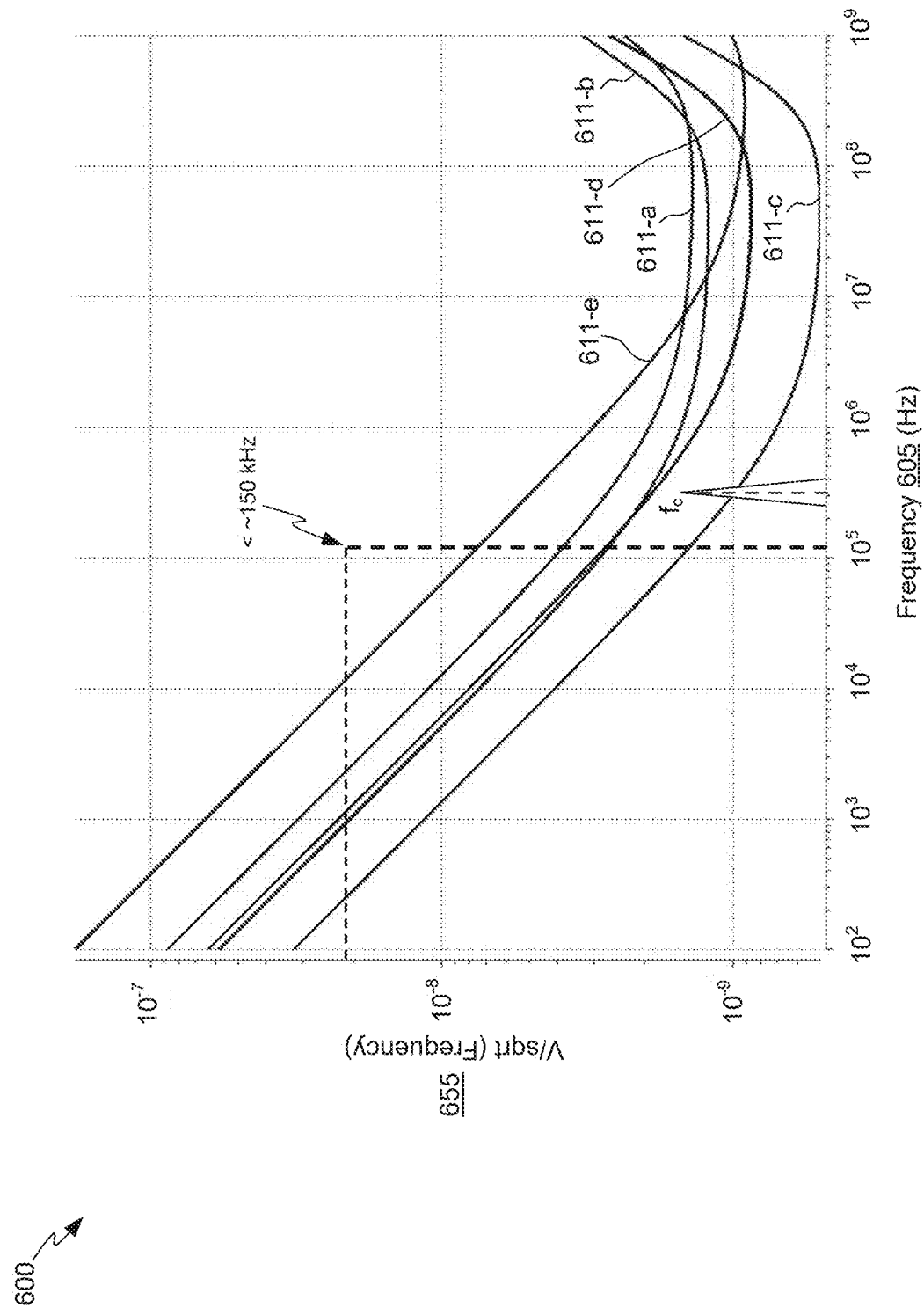
FIG. 6 is a graph depicting 1/f noise for various device sizes, in accordance with aspects of this disclosure.

FIG. 6 is a graph 600 depicting 1/f noise on vertical axis 655 (in units of volts per square root of Hz) against frequency on horizontal axis 605 (in units of Hz) for different device sizes. In FIG. 6, each of the curves 611-a . . . 611-e corresponds to a different device size (e.g., RTD resistances having different width/length ratios). In this regard, the resistance of a material can typically be represented as a function of its intrinsic resistance and its dimensions (e.g., length, width, and thickness). As can be seen, 1/f noise is quite high at low frequencies (e.g., frequencies less than 100-150 kHz) and adversely impacts the accuracy of RTD resistance measurements used to determine fly height. In one non-limiting example, the goal may be to detect a minimum resistance measurement signal for a 0.1 nm fly height, where the ΔR/fly height is 0.3 Ω/nm. A typical bias of about 2 mA may be applied to an RTD resistance of about 100Ω, in which case the minimum signal amplitude (peak-to-peak) is about 60 μV. When the frequency is about 150 kHz, the noise is about 7.7 μVrms (e.g., 20 nV/sqrt(Hz) at 150 kHz is about 7.7 μVrms of noise).

Figure 7:
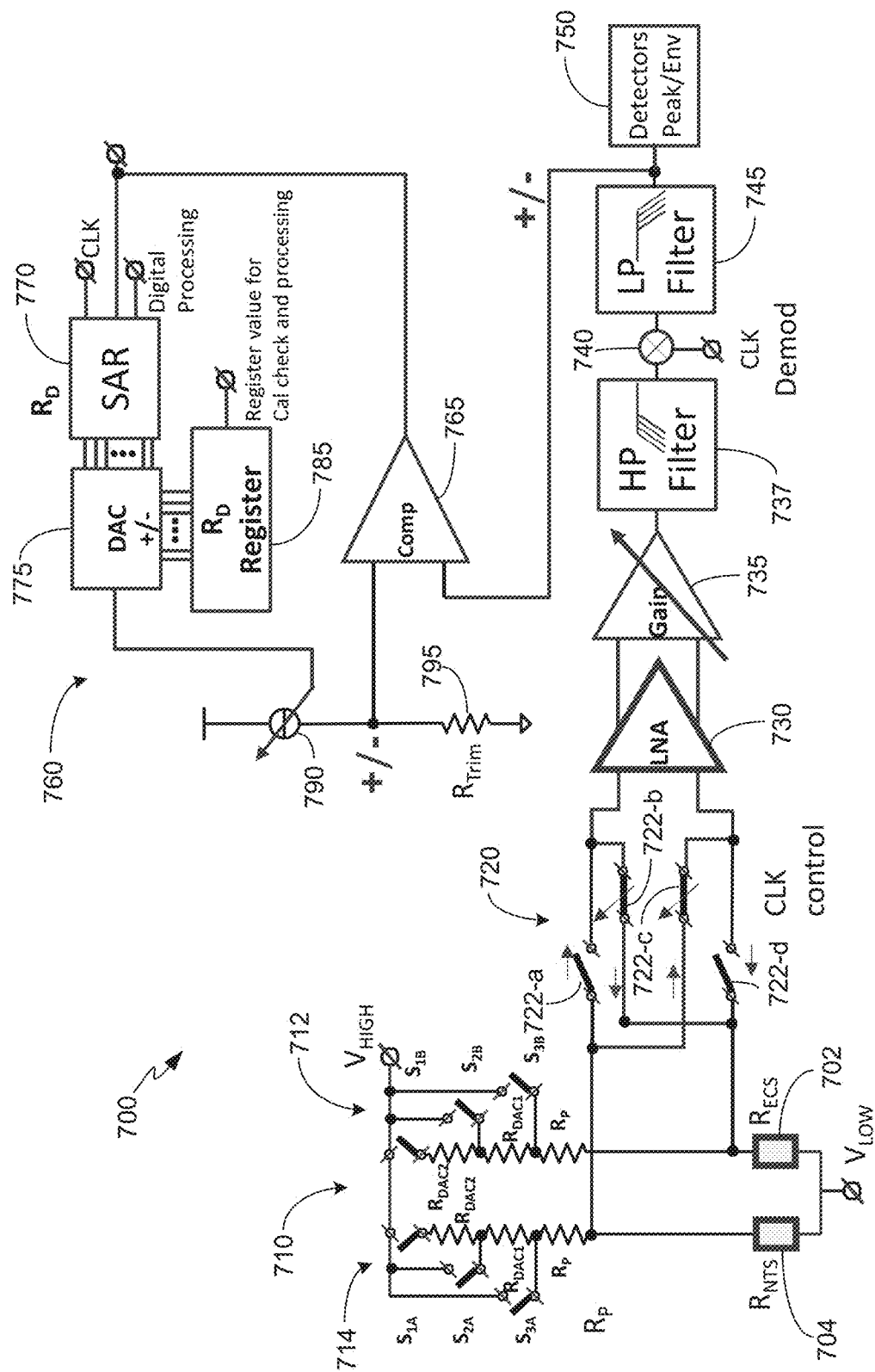
FIG. 7 is a schematic diagram of a circuit supporting dual mode and dual path monitoring and configured to perform differential sensing of first and second RTDs, in accordance with aspects of this disclosure.

In accordance with aspects of this disclosure, as described with respect to circuit 700 of FIG. 7, 1/f bias noise is mitigated by modulating ("chopping") the RTD signal to a higher frequency $f_c$, demodulating the signal to a lower frequency, and filtering. In addition, circuit 700 is configured for differential sensing of multiple RTDs, such as an embedded contact sensor (ECS) and a near-field temperature sensor (NTS). Moreover, circuit 700 is configured to automatically zero out or reduce any offset between the differential ECS and NTS bias voltages.

FIG. 7 is a schematic diagram of a circuit 700 supporting dual mode and dual path monitoring and configured to perform differential sensing of first and second RTDs 702 and 704, in accordance with aspects of this disclosure. In some examples, first RTD 702 is an ECS having resistance $R_{ECS}$ embedded in the slider near the read element (e.g., ECS 108-a of FIG. 3 embedded in slider 103 near read element 111), and second RTD 704 is an NTS having resistance $R_{NTS}$ embedded in the slider near the write element (e.g., NTS 108-b of FIG. 3 embedded in slider 103 near write element 110). Differential sensing of the ECS and NTS bias voltages provides a relative measurement that can be used in monitoring and adjusting fly height. While differential sensing of an ECS and an NTS is particularly suitable in HDDs configured for heat-assisted magnetic recording (HAMR), RTDs 702 and 704 could be other types of RTDs that are configured in circuit 700 for differential sensing. In one non-limiting example, RTDs 702 and 704 could be distributed RTDs where first RTD 702 is located relatively near the ABS and second RTD 704 is offset from the ABS. While first RTD 702 is referred to below as ECS 702 and second RTD 704 is referred to below as NTS 704, this is for sake of convenience only and this disclosure is not so limited.

ECS 702 and NTS 704 are coupled between a first voltage source $V_{LOW}$, which may control the slider bias, and a second voltage source $V_{HIGH}$, which may control the RTD or sensor bias. In some examples, $V_{HIGH}$ is set by the common mode of the sensor bias voltage, and in some examples, $V_{LOW}$ is set or controlled by the interface voltage control ($V_{IVC}$; see FIGS. 4A-4B). According to aspects of this disclosure, to zero out any inherent offset voltage that may introduce inaccuracies into the differential measurements of circuit 700, tuning bridge 710 is coupled between ECS 702 and $V_{HIGH}$, and between NTS 704 and $V_{HIGH}$. Even if resistances $R_{ECS}$ and $R_{NTS}$ are designed to be identical, slight variations in manufacturing can lead to differences in their resistance values, leading to a voltage offset. Zeroing out any such offset voltage is important because very small changes in the resistances of ECS 702 and NTS 704 must be precisely measured in order to accurately detect changes in fly height. Thus, in an initial or reference state, the bias voltage $V_{ECS}$ across ECS 702 and the bias voltage $V_{NTS}$ across NTS 704 should be equal. In other words, in a neutral or reference state, the difference between bias voltages $V_{ECS}$ and $V_{NTS}$ should be zero, meaning that there is no offset voltage.

Tuning bridge 710 comprises first branch 712 coupled between ECS 702 and $V_{HIGH}$ and second branch 714 coupled between NTS 704 and $V_{HIGH}$. First branch 712 comprises resistors $R_P$, $R_{DAC1}$, and $R_{DAC2}$ coupled in series between ECS 702 and $V_{HIGH}$ in that order. Likewise, second branch 714 comprises resistors $R_P$, $R_{DAC1}$, and $R_{DAC2}$ coupled in series between NTS 704 and $V_{HIGH}$ in that order. Tuning bridge 710 operates by selectively switching some or all of the resistors into or out of bridge 710, thereby fine tuning the circuit. By selectively switching resistances in or out of the circuit, the total resistance in each path can be adjusted to balance the circuit and zero out any voltage offset.

In particular, branch 712 comprises switches $S_{1B}$, $S_{2B}$, and $S_{3B}$. When switch $S_{1B}$ is closed and switches $S_{2B}$ and $S_{3B}$ are open, all three resistors $R_P$, $R_{DAC1}$, and $R_{DAC2}$ are coupled into branch 712 in series between ECS 702 and $V_{HIGH}$. When switch $S_{2B}$ is closed and switches $S_{1B}$ and $S_{3B}$ are open, resistors $R_P$ and $R_{DAC1}$ are coupled into branch 712 in series between ECS 702 and $V_{HIGH}$. When switch $S_{3B}$ is closed and switches $S_{1B}$ and $S_{2B}$ are open, only resistor $R_P$ is coupled into branch 712 between ECS 702 and $V_{HIGH}$. Likewise, branch 714 comprises switches $S_{1A}$, $S_{2A}$, and $S_{3A}$. When switch $S_{1A}$ is closed and switches $S_{2A}$ and $S_{3A}$ are open, all three resistors $R_P$, $R_{DAC1}$, and $R_{DAC2}$ are coupled into branch 714 in series between NTS 704 and $V_{HIGH}$. When switch $S_{2A}$ is closed and switches $S_{1A}$ and $S_{3A}$ are open, resistors $R_P$ and $R_{DAC1}$ are coupled into branch 714 in series between NTS 704 and $V_{HIGH}$. When switch $S_{3A}$ is closed and switches $S_{1A}$ and $S_{2A}$ are open, only resistor $R_P$ is coupled into branch 714 between NTS 704 and $V_{HIGH}$.

In operation, the voltage difference between the ECS bias voltage $V_{ECS}$ and the NTS bias voltage $V_{NTS}$ is initially measured and any voltage difference (offset is determined). Based on the measured offset, control circuitry 22 (e.g., SOC 101 and/or AE 102) determines which resistances to switch in or out. By switching certain resistances in or out, the total resistance in each path is adjusted to change the voltage drop across ECS 702 and NTS 704, aiming to make them equal and thereby zero out the offset. Thus, tuning bridge 710 and the switchable resistances offer a flexible way to zero out any voltage offsets, with fine-grained control over the resistances allowing for precise balancing of the circuit. In this regard, it should be noted that the switches and resistances illustrated in FIG. 7 are merely one possible example of how tuning bridge 710 may be configured. Tuning bridge 710 may be suitably configured in other ways, with greater or fewer resistors being switchable into and out of bridge 710. Moreover, it is possible that the resistance values of the resistors themselves may be varied or adjusted to provide even greater flexibility. In some implementations, $V_{HIGH}$ may be dithered, that is, implemented as a pulsing bias plus a DC bias, such that changes in slope of the bias signal can be tracked and are indicative of how close the head is to touchdown (TD).

After any voltage offsets are zeroed out by tuning bridge 710, the differentially-sensed bias voltages $V_{NTS}$ and $V_{ECS}$ are coupled to the differential inputs of low noise amplifier (LNA) 730. In some examples, LNA 730 may have a common gate configuration such as that shown in FIG. 4A, or LNA 730 may have a common source configuration as that shown in FIG. 4B. With either configuration, LNA 730 has a zero bias set to match the zero offset tuned by tuning bridge 710. According to aspects of this disclosure, to remove low frequency 1/f bias noise of the amplifier, a modulator implemented by chopping circuitry 720 is coupled between ECS 702/NTS 704 and LNA 730.

In some examples, chopping circuitry 720 comprises switches 722 (e.g., switches 722-a, 722-b, 722-c, 722-d) arranged in an "H-bridge" configuration. Switches 722 are controlled by a first clock signal at a desired modulation frequency or carrier frequency $f_c$, serving to alternate the polarity of the differential voltage signal and effectively "chopping" the differential voltage signal at the modulation frequency. In particular, when switches 722-a and 722-d are open, switches 722-b and 722-c are closed, and vice-versa. Chopping circuitry 720 effectively multiplies the differential voltage between ECS 702 and NTS 704 by a square wave at the higher clock frequency. In some examples, the differential voltage is modulated to a frequency of greater than 400 kHz (0.4 MHz). This modulation effectively moves the signal and any associated bias and low frequency 1/f noise to a higher frequency domain, where any unwanted low frequency noise can be more easily filtered and removed.

After chopping, the modulated signal is amplified by LNA 730. Low frequency 1/f noise is less significant at this stage because the signal is at a higher frequency after modulation by chopping circuitry 720. The amplified output of LNA 730 is fed to gain amplifier 735, which further amplifiers the signal to a desired level. High pass filter (HPF) 737 provides additional immunity to 1/f noise by adding high pass filtering below the clock frequency after gain stage 735. Following amplification by gain amplifier 735 and filtering by HPF 737, the signal is demodulated at demodulator 740. Demodulator 740 performs the inverse operation of modulation, effectively extracting the original signal from a modulated carrier wave. The signal is shifted back to its original frequency range while leaving the noise at higher frequencies that can be easily filtered out by low pass filter (LPF) 745. Demodulation typically involves multiplying the amplified and modulated signal by a square wave at the same frequency as the original modulation, which shifts the signal back to its original frequency. Following demodulator 740, the demodulated signal is passed through LPF 745. LPF 745 filters out any signals above an Nth order cut-off frequency, which may be about 200 kHz (i.e., about half of the modulation frequency). This is effective to filter out any 1/f bias noise from the output signal, since the 1/f noises was left at higher frequencies following demodulation. LNA 730, gain amplifier 735, demodulator 740 and LPF 745 effectively serve as a lock-in amplifier by allowing a signal with a known carrier wave to be extracted from a high noise environment.

After LPF 745, the demodulated and filtered output signal is provided to peak/envelope detector 750. Peak/envelope detector 750 extracts characteristics of the signal such as peak amplitude and envelope shape, which may be used in AC mode during the manufacturing process for defect scanning. For example, peak/envelope detector may detect signal spikes in the HF response in order to identify defects in disks of the HDD. Thus, peak/envelope detector 750 may be considered as part of the AC (HF) path of circuit 700 used for defect scanning during HDD manufacturing.

The demodulated and filtered output signal from LPF 745 is also coupled to RTD resistance detection circuit 760, which may be considered as the LF (DC) path for detection of RTD resistance and changes in RTD resistance, which in turn are indicators of fly height and fly height changes. The output of LPF filter 745 is coupled to a first input of comparator 765. The output of comparator 765 is fed through a digital processing feedback loop that includes successive approximation register (SAR) 770, digital-to-analog converter (DAC) 775, and controlled current source 790. The output of comparator 765 is coupled to the input of SAR 770. DAC 775 is used in conjunction with SAR 770 to determine the RTD resistance value delta (i.e., the differential between the resistance values of ECS 702 and NTS 704), $R_D$. Register 785 is used in conjunction with SAR 780 to store the $R_D$ value from DAC 775.

The output of DAC 775 is coupled to controlled current source 790, which in turn is coupled to the second input of comparator 765, completing the feedback loop. The output of controlled current source 790 is also coupled across trimming resistor 795. Trimming resistor 795 assists in resistance measurements, for example, when the reference current is trimmed for accuracy of voltage measurements, and where voltage measurements are taken across trimming resistor 795.

Gain calibration of gain stage 735 is performed by adjusting the switches of tuning bridge 710 to a known offset, where the gain goes through an iterative process to set the measured value to the desired $R_D$ target. Once the gain is set, the switches of tuning bridge 710 are reset back to the zero-offset input for the amplifier.

FIG. 8A is a graph 800-a illustrating low frequency, high frequency, and noise components of the input voltage signal to LNA 730 of FIG. 7, in accordance with aspects of this disclosure. The signal of FIG. 8A includes noise components such as (without limitation) low frequency 1/f noise and amplifier noise. In accordance with this disclosure, modulation of the signal+noise facilitates removal of the noise component. FIG. 8B is a graph 800-b of a demodulated HF or AC signal extracted from the signal of FIG. 8A, and FIG. 8C is a graph 800-c of a demodulated LF or DC signal extracted from the signal of FIG. 8A, according to various aspects of this disclosure. As described above, the demodulated low frequency signal component is extracted for monitoring and detecting the differential ECS/NTS bias voltage and changes in the differential ECS/NTS bias voltage, which correspond to fly height and changes in fly height. The demodulated high frequency signal component may be utilized for defect scanning (detection of spikes) during the HDD manufacturing process.

FIG. 8D is a graph 800-d showing the gain 810 for a LF path 830 against frequency 805, in accordance with aspects of this disclosure. Here, the input signal at LNA 730 has been modulated using a first carrier frequency $f_c$, (e.g., ~400-500 kHz or 0.4-0.5 MHz), thereby shifting it up in the frequency domain. After signal amplification by LNA 730 and gain amplifier 735, the LF path signal is demodulated at demodulator 740 using the same carrier frequency $f_c$. The demodulated signal is passed through LPF 745 to extract the low frequency differential RTD signal. FIG. 8D also depicts the Nth order cut-off frequency of LPF 745. As noted above, the $N^{th}$ order cut-off frequency of LPF 745 may be selected based on the carrier frequency $f_c$ used for modulation. In this example, the differential RTD signal has been modulated to about 400-500 kHz and the Nth order cut-off frequency of the low-pass filter is 200 kHz. In some examples, the Nth order cut-off frequency is less than half of the carrier frequency to prevent aliasing issues. The modulation frequency and LPF cut off frequency discussed herein are purposes of example only and are not limiting. Other ranges of frequencies are contemplated and may be used.

The methods and flow diagrams disclosed herein are implemented by control circuitry 22, which may be implemented partially or wholly into an integrated circuit (IC) such as system-on-a-chip (SOC) 101, arm electronics (AE) 102 (FIG. 3), and/or any other suitable circuitry or controller. Control circuitry 22 may further comprise a microprocessor executing instructions operable to perform the methods and flow diagrams described herein. The instructions may be stored in a computer-readable medium, such as a non-volatile semiconductor memory device that may be external to the microprocessor or integrated with the microprocessor in SOC 101. The instructions may alternatively be stored on a disk and read into a volatile semiconductor memory when the HDD is powered on. Control circuitry 22 may comprise logic circuitry such as state machine circuitry or other suitable logic circuitry. The methods and flow diagrams disclosed herein may be implemented using analog circuitry, digital circuitry, or a combination thereof.

One or more processing devices may comprise control circuitry 22 and may perform some or all of the functions of control circuitry 22. Such processing devices may be part of the HDD and/or abstracted away from physically proximity to the HDD. Such processing devices may be part of or proximate to one or more unitary products, racks comprising multiple data storage devices, physical or virtual servers, local area networks, storage area networks, data centers, and/or cloud services. Disk drives or HDDs as disclosed herein may include magnetic, optical, hybrid, or other types of disk drives. Devices such as computing devices, data servers, media content storage devices, and other devices may comprise the storage media and control circuitry described herein.

While certain embodiments are described herein, these embodiments are presented by way of example only, and do not limit the scope of this disclosure. Various omissions, substitutions and changes may be made without departing from the spirit and scope of this disclosure. The methods and processes described herein are not limited to any particular sequence and may be used independently or combined in various ways. Some method or process steps may be omitted and other steps added in some implementations. Nothing in this description implies that any particular feature, component, characteristic, or step is necessary or indispensable. Many variations, modifications, additions, and improvements are possible and fall within the scope of this disclosure as defined by the following claims.

The invention claimed is:

1. A data storage device comprising:
a first resistive temperature detector (RTD) and a second RTD coupled to a first voltage source;
a tuning bridge coupled between the first and second RTDs and a second voltage source, the tuning bridge being configured to reduce offset between a first bias voltage across the first RTD and a second bias voltage across the second RTD;
a low noise amplifier (LNA) configured to receive the first bias voltage and the second bias voltage as a differential bias voltage; and
a modulator coupled between the first and second RTDs and the LNA to modulate the differential bias voltage.

2. The data storage device of claim 1, wherein the RTD comprises a common gate topology.

3. The data storage device of claim 1, wherein the RTD comprises a common source topology.

4. The data storage device of claim 1, wherein the tuning bridge comprises:
a first branch of switchable resistors coupled between the first RTD and the second voltage source; and
a second branch of switchable resistors coupled between the second RTD and the second voltage source.

5. The data storage device of claim 1, wherein the modulator comprises a chopping circuit comprising a plurality of switches coupled between the first and second RTDs and the LNA that are opened and closed at a carrier frequency.

6. The data storage device of claim 5, further comprising:
a demodulator coupled to the LNA and configured to demodulate the modulated differential bias voltage; and
a low pass filter coupled to the demodulator and configured to remove 1/f bias noise from the demodulated differential bias voltage.

7. The data storage device of claim 6, wherein
the carrier frequency is equal to or greater than 400 kHz; and
a cut-off frequency of the low pass filter is less than half of the carrier frequency.

8. The data storage device of claim 1, further comprising:
a high frequency (HF) path configured to detect defects in a manufacturing process; and
a low frequency (LF) path configured to determine fly height and changes in fly height based on the differential bias voltage and changes in the differential bias voltage.

9. The data storage device of claim 8, wherein:
the HF path comprises a peak/envelope detector; and
the LF path comprises a comparator comparing the differential bias voltage with feedback from a successive approximation register (SAR) and a digital-to-analog converter (DAC).

10. The data storage device of claim 1, further comprising:
a slider comprising a read element and a write element, wherein
the first RTD is an embedded contact sensor (ECS) associated with the read element; and
the second RTD is a near-field temperature sensor (NTS) associated with the write element.

11. The data storage device of claim 10, wherein
the first voltage source controls a bias potential of the slider; and
the second voltage source controls a bias potential of the first and second RTDs.

12. The data storage device of claim 10, wherein the ECS and the NTS each have a single path resistance detection circuit and wherein differential sensing is performed by subtracting the single path sense of the ECS resistance detection circuit from the single path sense of the NTS resistance detection circuit.

13. A method for differential sensing of bias voltages across resistive temperature detectors (RTDs) in a data storage device, comprising:
- generating a first bias voltage across a first RTD coupled between a first voltage source and a second voltage source and a second bias voltage across a second RTD coupled between the first and second voltage sources;
- reducing offset between the first bias voltage and the second bias voltage; and
- modulating a differential bias voltage between the first RTD and the second RTD and amplifying the modulated differential bias voltage.

14. The method of claim 13, wherein reducing offset comprises switching resistances in or out of a path between the first and second RTDs and the second bias voltage.

15. The method of claim 13, wherein modulating the differential bias comprises opening and closing a plurality of switches coupled between the first and second RTDs and a low noise amplifier (LNA) at a carrier frequency.

16. The method of claim 13, further comprising:
- demodulating the modulated and amplified differential bias voltage; and
- removing 1/f bias noise by passing the demodulated differential bias voltage through a low pass filter.

17. The method of claim 13, wherein
- the first RTD is an embedded contact sensor (ECS) associated with a read element of a slider; and
- the second RTD is a near-field temperature sensor (NTS) associated with a write element of the slider.

18. The method of claim 17, further comprising:
- controlling a bias potential of the slider with the first voltage source; and
- controlling a bias potential of the first and second RTDs with the second voltage source.

19. A circuit for differential sensing of bias voltages across resistive temperature detectors (RTDs) in a data storage device, comprising:
- a first RTD and a second RTD coupled to a first voltage source;
- a tuning bridge coupled between the first and second RTDs and a second voltage source, the tuning bridge being configured to reduce offset between a first bias voltage across the first RTD and a second bias voltage across the second RTD; and
- a low noise amplifier (LNA) configured to receive the first bias voltage and the second bias voltage as a differential bias voltage.

20. The circuit of claim 19, wherein the tuning bridge comprises:
- a first branch of switchable resistors coupled between the first RTD and the second voltage source; and
- a second branch of switchable resistors coupled between the second RTD and the second voltage source.

21. The circuit of claim 19, further comprising a modulator coupled between the first and second RTDs and the LNA to modulate the differential bias voltage.

22. The circuit of claim 21, wherein the modulator is a chopping circuit comprising a plurality of switches coupled between the first and second RTDs and the LNA that are opened and closed at a carrier frequency.

23. The circuit of claim 19, wherein
- the first RTD is an embedded contact sensor (ECS) associated with a read element of a slider; and
- the second RTD is a near-field temperature sensor (NTS) associated with a write element of the slider.

24. A data storage device comprising:
- a first resistive temperature detector (RTD) coupled between a first voltage source and a second voltage source;
- a second RTD coupled between the first voltage source and the second voltage source;
- a low noise amplifier (LNA) configured to receive a first bias voltage across the first RTD and a second bias voltage across the second RTD as a differential bias voltage; and
- a modulator coupled between the first and second RTDs and the LNA to modulate the differential bias voltage.

25. The data storage device of claim 24, wherein the modulator comprises a chopping circuit comprising a plurality of switches coupled between the first and second RTDs and the LNA that are opened and closed at a carrier frequency.

26. The data storage device of claim 24, further comprising:
- a demodulator coupled to the LNA and configured to demodulate the modulated differential bias voltage; and
- a low pass filter coupled to the demodulator and configured to remove 1/f bias noise from the demodulated differential bias voltage.

* * * * *